United States Patent [19]

Dodt et al.

[11] Patent Number: 5,526,198

[45] Date of Patent: * Jun. 11, 1996

[54] METHOD AND APPARATUS FOR ADMINISTERING VIDEO DATA ON MAGNETIC TAPE MEDIA USING A DATA RECORD FORMAT TO STORE VIDEO FRAMES

[75] Inventors: William C. Dodt, Broomfield; Jerry L. Donze, Arvada, both of Colo.

[73] Assignee: Storage Technology Corporation, Louisville, Colo.

[*] Notice: The term of this patent shall not extend beyond the expiration date of Pat. No. 5,369,641.

[21] Appl. No.: 242,719

[22] Filed: May 13, 1994

Related U.S. Application Data

[63] Continuation-in-part of Ser. No. 791,793, Nov. 12, 1991, Pat. No. 5,369,641.

[51] Int. Cl.[6] .................... G11B 5/09; G11B 5/02; H04N 5/78
[52] U.S. Cl. ............................. 360/48; 360/19.1
[58] Field of Search .................... 358/341, 343; 371/2.2, 37.4; 360/48, 53, 46, 60, 33.1, 27, 14.2, 19.1

[56] References Cited

U.S. PATENT DOCUMENTS

| | | | |
|---|---|---|---|
| 5,311,372 | 5/1994 | Matsumi et al. | 360/22 X |
| 5,325,370 | 6/1994 | Cleveland et al. | 371/37.4 |
| 5,359,464 | 10/1994 | Wilkinson | 360/33.1 |
| 5,369,532 | 11/1994 | Dodt et al. | 360/48 |
| 5,369,641 | 11/1994 | Dodt et al. | 371/2.2 |

*Primary Examiner*—Aristotelis Psitos
*Assistant Examiner*—Patrick Wamsley
*Attorney, Agent, or Firm*—Duft, Graziano & Forest

[57] ABSTRACT

The video-to-data converter buffers and converts the video data received from a camera or a conventional video tape drive into a data record format that is compatible with a computer data tape drive subsystem and its media, such as a 3480-type magnetic tape cartridge. In addition, a header is interposed between a leader portion of the magnetic tape and the remainder of the magnetic tape. This header segment contains two sections, a first of which is a data record directory that is used by the control unit to denote the location of each data record on the magnetic tape as well as administrative data associated with the data record. The second section of the header is an administrative information section that contains data relating to the magnetic tape itself.

24 Claims, 11 Drawing Sheets

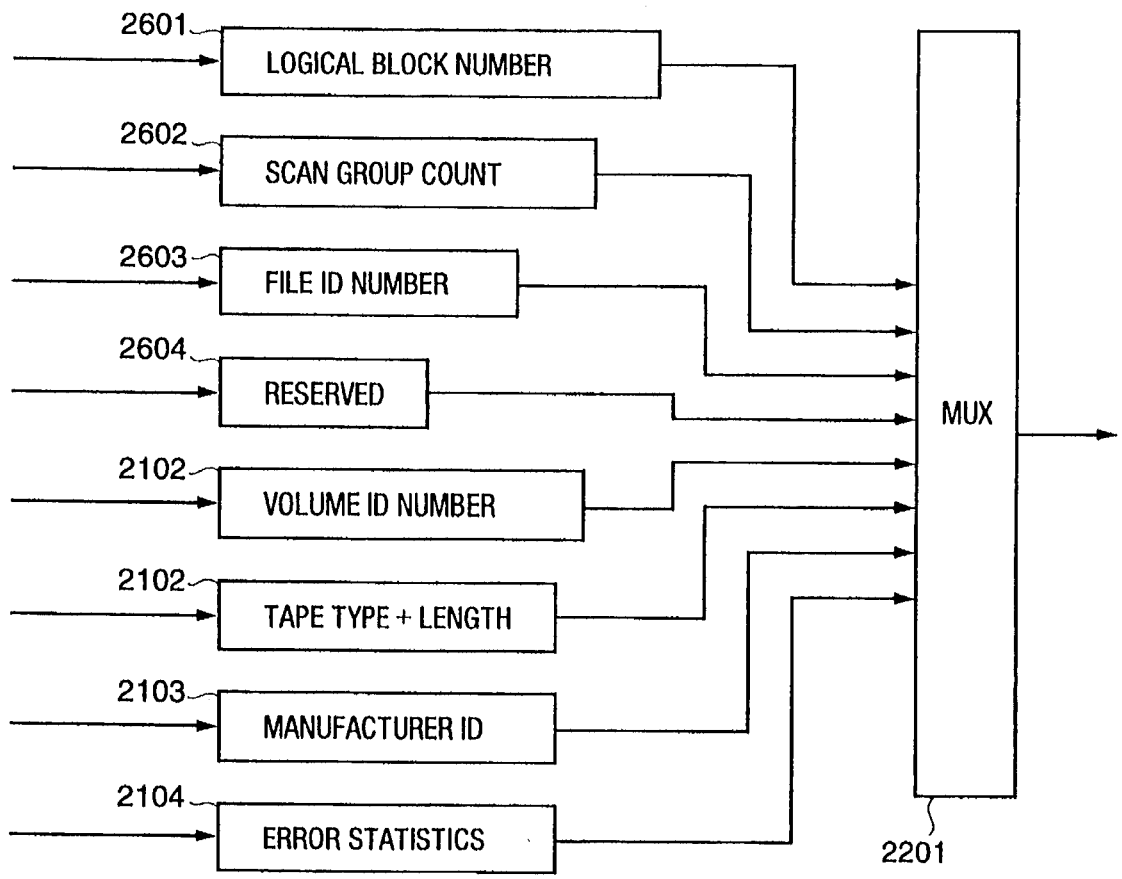
FIG.4
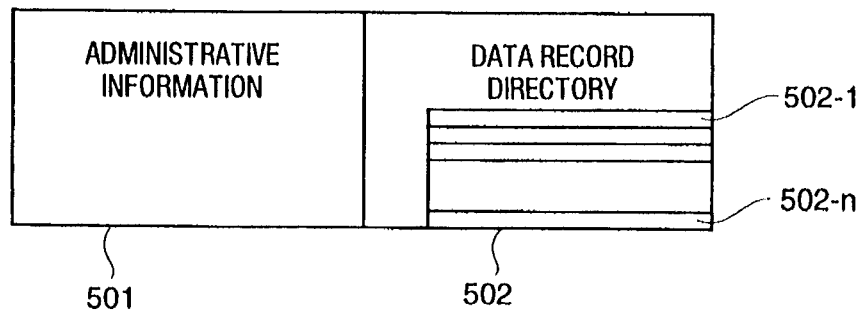

FIG. 6

| PHYSICAL SCAN GROUP COUNT | FILE ID NUMBER | LOGICAL BLOCK NO. OF HOST DATA PACKET | RESERVED |
|---|---|---|---|
| 4 BYTES | 3 BYTES | 5 BYTES | 20 BYTES |
| 601 | 602 | 603 | 604 |

FIG. 10

| VOLUME ID | TAPE TYPE AND LENGTH | MFG ID | USEAGE STATISTICS | RECORDING TYPE | LAST SCAN GROUP | ERROR STATISTICS |
|---|---|---|---|---|---|---|
| 80 BYTES | 1 BYTE | 128 BYTES | Y BYTES | 1 BYTE | 4 BYTES | X BYTES |
| 1001 | 1002 | 1003 | 1004 | 1005 | 1006 | 1007 |

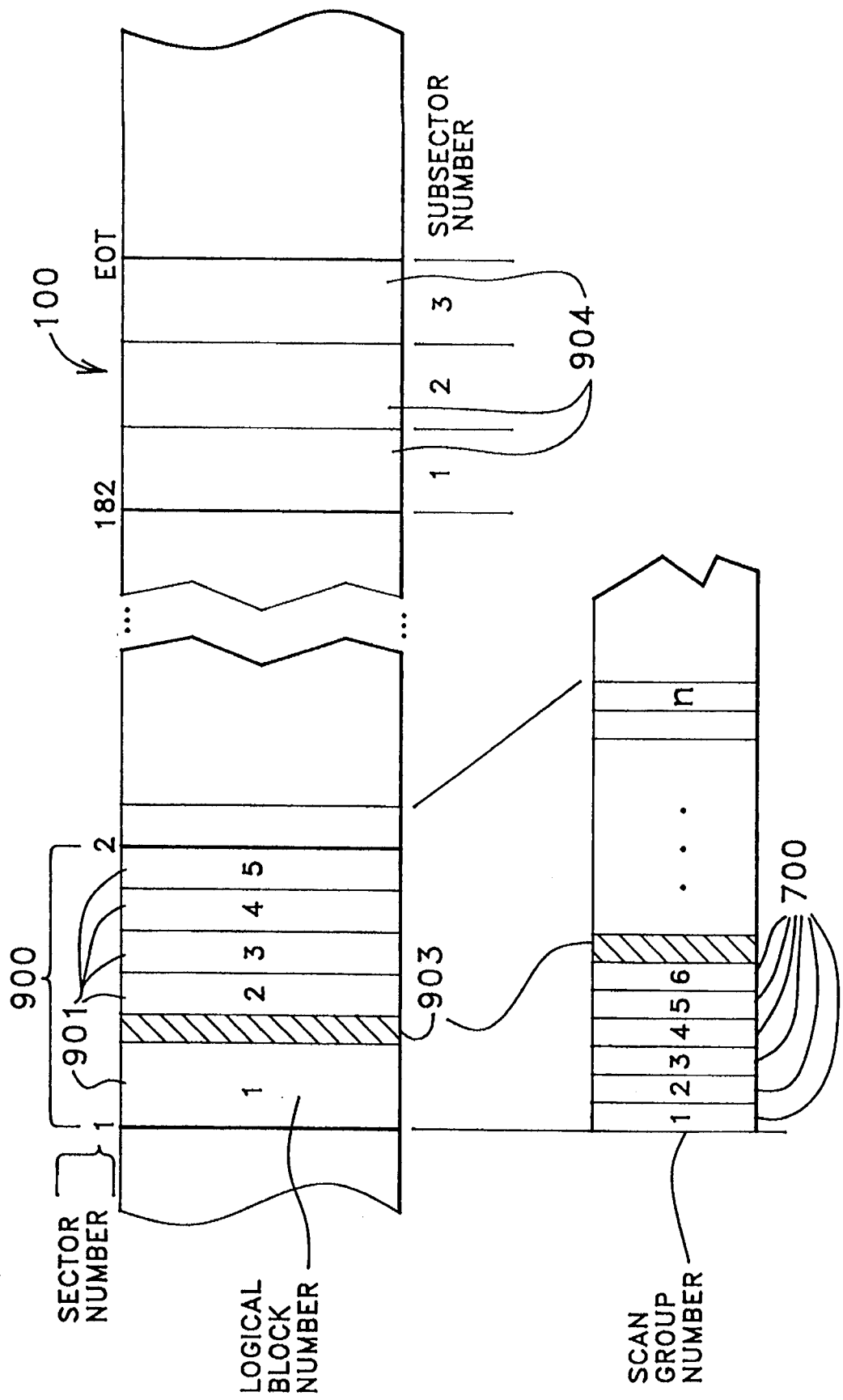

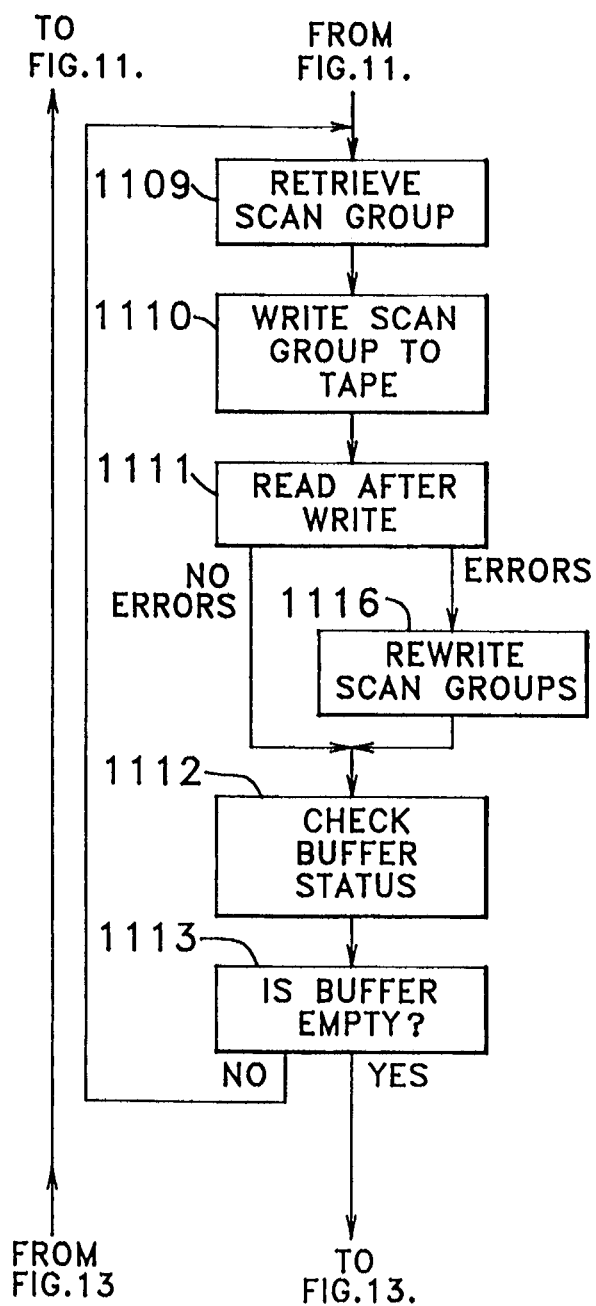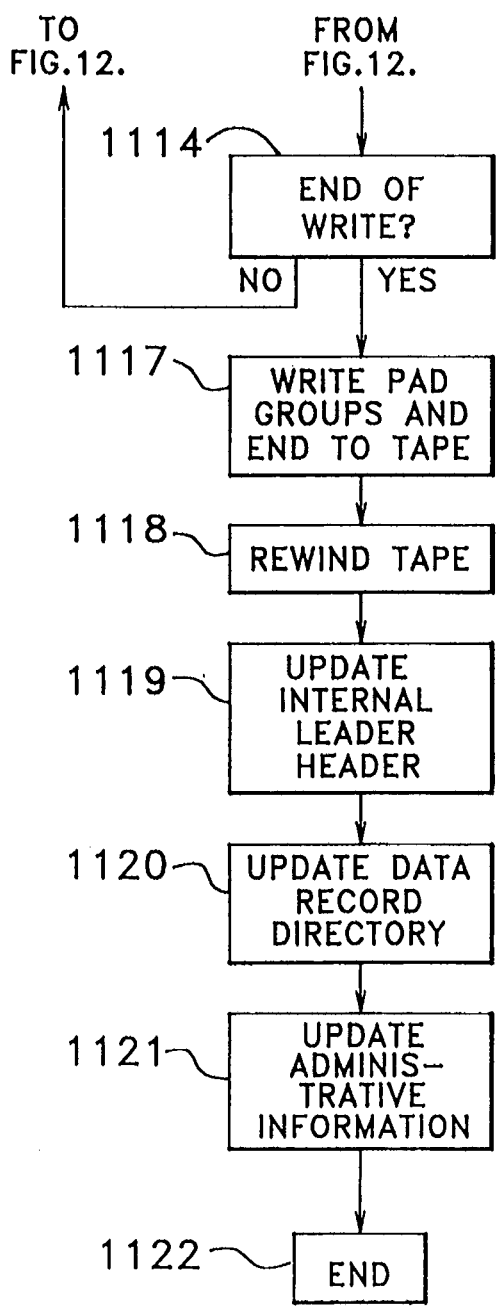

METHOD AND APPARATUS FOR ADMINISTERING VIDEO DATA ON MAGNETIC TAPE MEDIA USING A DATA RECORD FORMAT TO STORE VIDEO FRAMES

CROSS REFERENCE TO RELATED APPLICATIONS

This application is a continuation in part of U.S. patent application Ser. No. 07/791,793, now U.S. Pat. No. 5,369,641 titled "Method and Apparatus for Detecting and Correcting Errors in Data on Magnetic Tape Media", filed Nov. 12, 1991.

FIELD OF THE INVENTION

This invention relates to magnetic data storage media and, in particular, to a method and apparatus for administering video data that is written on magnetic tape media.

PROBLEM

It is a problem in the field of data storage systems to maximize the data storage capacity of the data storage media while minimizing the cost of the media, maximizing the data integrity and minimizing the data retrieval time. Magnetic tape has become the industry standard data storage media for the storage and retrieval of large amounts of data, where the media cost must be kept to a minimum and the data retrieval time is not a critical factor. The data storage capacity and media cost of magnetic tape have been reduced by the use of helical scan data recording techniques on magnetic tape media.

Helical scan tape drive systems can make use of either dual reel tape cassettes or the single reel tape cartridge, both of which use half inch magnetic tape as the recording media. The dual reel form factor is used in the video recording industry while the single reel magnetic tape cartridge is an industry standard media form factor used in the data processing industry. The selection of the single reel form factor in the data processing industry is desirable due to the fact that automated library systems, such as the 4400 Automated Cartridge System (ACS) manufactured by Storage Technology Corporation of Louisville, Colo., are presently used to robotically store and retrieve a large number of 3480-type magnetic tape cartridges for an associated plurality of tape drives. Thus, a computer system can access vast quantities of data in a timely manner via the use of the automated library system to retrieve and mount a desired tape cartridge on a tape drive. In contrast, video cassettes are typically mounted in a tape drive by a user, with a single tape cassette representing the entirety of the data retrieval process. Thus, the video cassette and computer data cartridge represent data storage media solutions to two diverse and largely mutually exclusive sets of requirements.

In addition, video data differs from computer data in that the video data is presently written in serial form, without management of framing information. In particular, the video data is presented to the user on a frame basis, yet is stored on the magnetic tape on a serial, unindexed basis. There presently does not exist any mechanism for reliably administering the video data on a frame basis that are written on to a mountable magnetic tape media. In addition, the video data is designed for continuous recording and playback, without error detection and correction being performed on the data. The data is transmitted with any errors that may be included, since by its very nature, video storage and retrieval does not retry a stored data record or play back the data storage medium to correct detected errors. A single pass is all that is available. In contrast, computer data storage systems provide error recovery time in both the reading and writing of data on the data storage medium. It is critical that the data be written correctly and read error free. The data integrity in a computer data storage system is therefore orders of magnitude better than video data storage systems, but computer data storage systems cannot continuously output data as required by video systems due to the error recovery process that is inherent in these systems. Therefore, the video and computer data storage and retrieval systems remain incompatible, in spite of the use of digital recording techniques in the video industry. There is presently no tape drive system that is useable for both video data and computer data due to the contradictory basic requirements for both systems.

SOLUTION

The above described problems are solved and a technical advance achieved in the field by the method and apparatus of the present invention for administering video data on a magnetic tape medium. This is accomplished by the use of an interface unit that can be located in the control unit of a tape drive subsystem and which converts the frame by frame video and associated audio data into a data storage format that is compatible with the computer data tape drive subsystem. In this system, the video data received from a camera or a conventional video tape drive is buffered and converted into a format that is compatible with a computer tape drive subsystem and its media, such as a 3480-type magnetic tape cartridge. In addition, a header is interposed between a leader portion of the magnetic tape on the 3480-type cartridge and the remainder of the magnetic tape contained therein. This header segment contains two sections, a first of which is a data record directory that is used by the control unit to denote the location of each data record written on to the magnetic tape as well as administrative information associated with the data record. The second section of the header is an administrative information section that contains data relating to the magnetic tape itself.

In operation, whenever the 3480-type magnetic tape cartridge is mounted in the tape drive subsystem and the magnetic tape contained therein threaded through the tape threading path onto the tape drive takeup reel, the tape drive control unit accesses the header segment of the magnetic tape to read the administrative data written thereon. If a read data record operation is requested, the identity of the requested data (data record) is used to scan the data record directory section of the header segment to locate the directory entry relating to the requested data record. Once this directory-entry for the requested data record has been located, the control unit can retrieve the information, contained within this directory entry, indicative of the physical position of the requested data record on the magnetic tape. This physical positioning information can then be used by the tape drive subsystem to quickly and precisely position the beginning of this data record under the read/write heads of the tape drive subsystem. The use of this positioning information reduces the tape positioning time, thereby improving the data retrieval time of the tape drive subsystem. The positioning information is indicative of the physical location of the data record on the magnetic tape and the magnetic tape typically includes positioning information written into at least one of the longitudinal tracks contained on the helical scan magnetic tape. This same positioning information is available to locate the end of the last data record written on the magnetic tape to enable the tape drive subsystem to write the next successive data record at the physical end of the last previously written data record.

The tape drive control unit records data on the magnetic tape in helical scan format, with each stripe of data written on the magnetic tape comprising a block of data containing a fixed number of bytes of data, with control and error check bits prepended and appended to each block of data to ensure data integrity. The video data received from a video source can be written on to the magnetic tape in this tape drive subsystem, with the data record indexing capability being used to quickly locate selected video segments that are recorded on the magnetic tape. The video data can be compressed pursuant to a variable compression algorithm and partitioned on a frame basis, so that it can be retrieved from the magnetic tape on a frame integral basis to produce a still image. The tape drive control unit records data on the magnetic tape in helical scan format, with each stripe of data written on the magnetic tape comprising a block of data containing a fixed number of bytes of data, with control and error check bits prepended and appended to each block of data.

BRIEF DESCRIPTION OF THE DRAWING

FIG. 4 illustrates in block diagram form the elements used to create and update the header segment of the magnetic tape;

FIG. 5 illustrates the elements contained in the header segment of the magnetic tape;

FIG. 6 illustrates the elements contained in the directory section of the header segment of the magnetic tape;

FIG. 9 illustrates the positioning information recorded on the magnetic tape;

FIG. 10 illustrates the elements contained in the administrative section of the header segment of the magnetic tape;

FIGS. 11–13 illustrate in flow diagram form the operational steps taken by the control unit to perform a number of operations on the magnetic tape;

DETAILED DESCRIPTION

Tape Drive System Architecture

Figure 3:
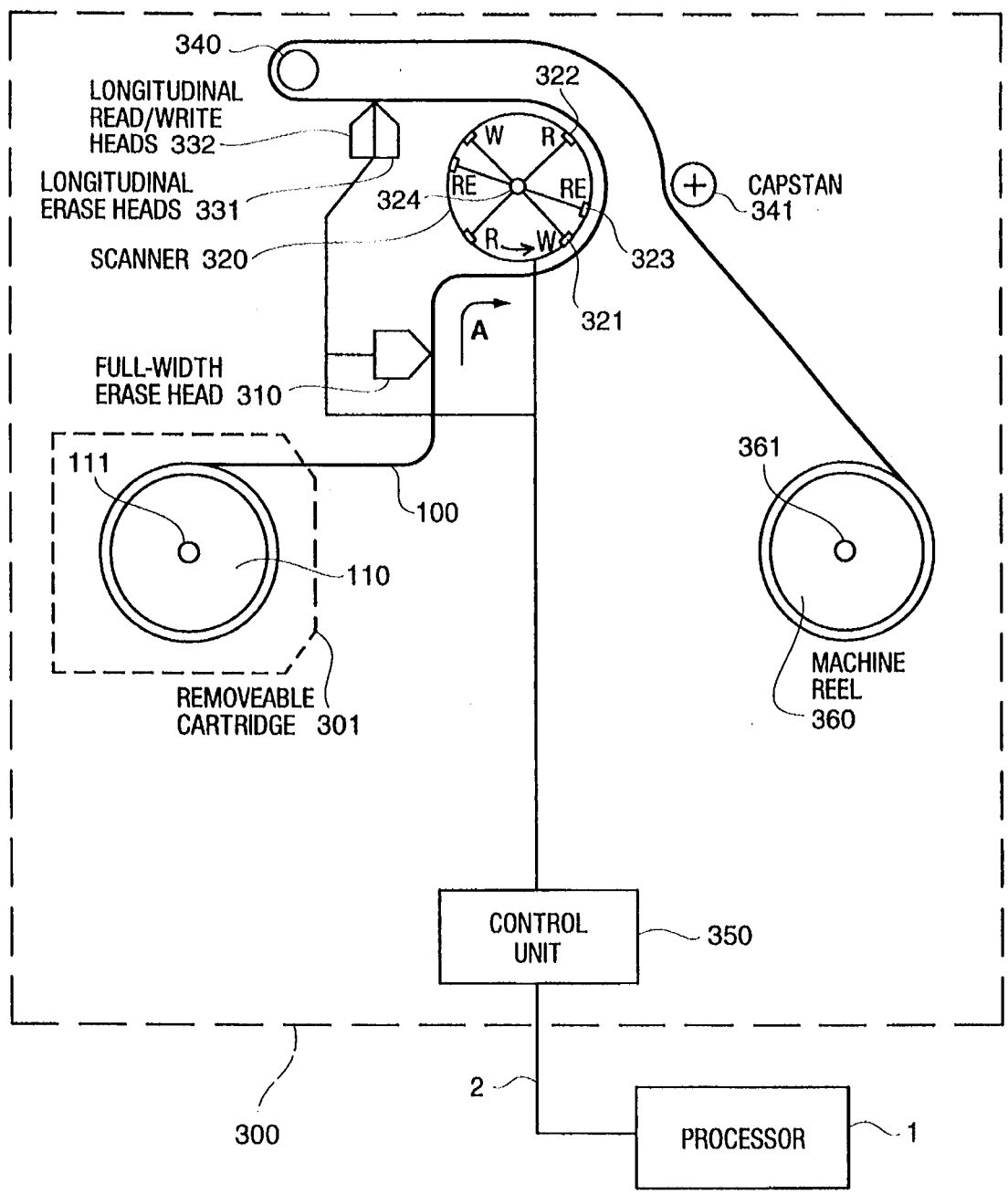
FIG. 3 illustrates in block diagram form the overall architecture of the tape drive control unit.

The apparatus illustrated in FIG. 3 represents the well known tape transport elements found in helical scan tape drive subsystems 300 that are used to read and write data on magnetic tape 100. The magnetic tape 100 is wound on a single reel 110 which rotates around spindle 111 within magnetic tape cartridge 301. In a helical scan tape drive subsystem 300, magnetic tape 100 from magnetic tape cartridge 301 is threaded in direction A past a fixed full width erase head 310, scanner 320 (which contains two pairs of helical read heads 322 and two pairs of helical write heads 321 and one pair of erase heads 323), a fixed longitudinal erase head 331 and a fixed longitudinal read/write head 332. The magnetic tape 100 then passes around guide 340, over capstan 341 to be wound on machine reel 360 which rotates around spindle 361. The full width erase head 310 erases the entire width of magnetic tape 100 and is used when data is recorded on virgin tape. It is also used when data is recorded on a previously used magnetic tape, if none of the data previously recorded on magnetic tape 100 is to be preserved.

Host processor 1 transmits a stream of data records to control unit 350 in tape drive subsystem 300, where the data records are formatted for writing in helical scan form on magnetic tape 100 via scanner 320. The tape wrap angle around scanner 320 is slightly greater than 180° so that a pair of read heads 322, a pair of write heads 321 and one erase head 323 are constantly in contact with magnetic tape 100 in order to continuously read and write data thereon. The helical write head pairs 321 simultaneously record two tracks of data at a time on magnetic tape 100 with an azimuth angle between adjacent tracks being approximately plus and minus 20°. Similarly, helical read head pairs 322 simultaneously play back two tracks of data at a time from magnetic tape 100. There are also three fixed longitudinal erase 331 and read/write heads 332 to read and write data on the corresponding three longitudinal tracks contained on magnetic tape 100: control, time code and one to be determined. These three longitudinal read/write heads 332 can be used individually or in any combination when editing new information into prerecorded data.

Physical Format of Helical Scan Magnetic Tape

Figure 1:
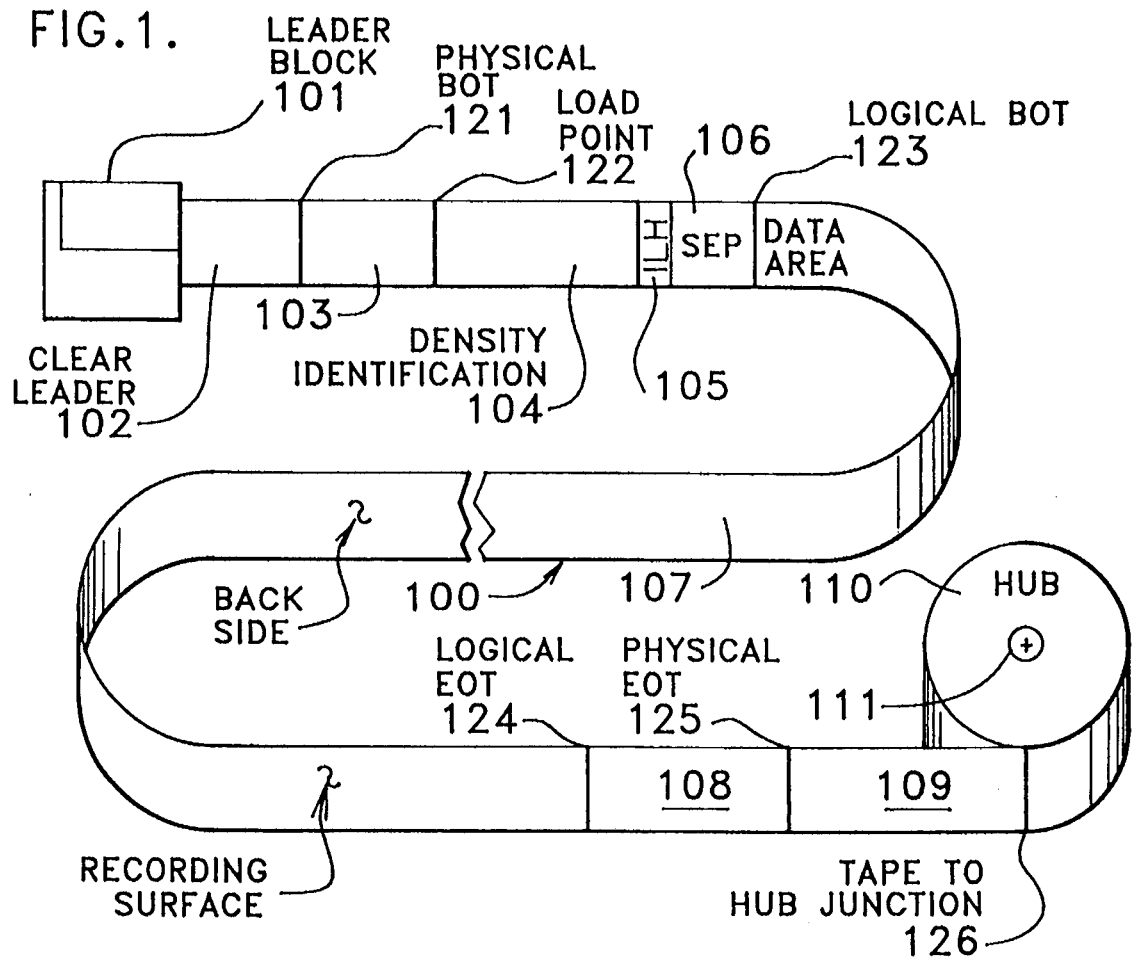
FIG. 1 illustrates the physical format of the magnetic tape media.

FIG. 1 illustrates the physical format of the helical scan magnetic tape 100, including the header (ILH) segment 105 thereof (also termed internal leader header). The magnetic tape 100 includes a leader block 101 that is attached at one end thereto and a single reel 110 around which magnetic tape 100 is wound into cartridge 301. A length of leader 103 is interposed between the leader block 101 and the density identification segment 104 of magnetic tape 100. The leader section 103 includes a beginning of tape hole 102 which provides an indication to the tape drive subsystem 300 that the one end of the magnetic tape 100 is reached. The density identification segment 104 typically consists of 256 scan groups 700 (FIG. 7) written on magnetic tape 100. The density identification segment 104 represents data, for tape drive control unit 350 to access, indicative of the format of the data recorded on magnetic tape 100. Internal leader header segment 105 is located at the end of density identification segment 104 of magnetic tape 100. The internal leader header 105 consists of a three scan groups 700, the third of which is an ECC scan group to error check the two preceding internal leader header scan groups. The internal leader header 105 is followed by separator segment 106 of magnetic tape 100, which typically consists of 125 scan groups. The separator segment 106 isolates the logical beginning of tape (BOT) 123, which is the start of the data area 107 of magnetic tape 100, from the prepended header information described above. The data area 107 of magnetic tape 100 constitutes the majority of magnetic tape 100 and ends at physical end of tape 125 which is a predetermined distance from tape to hub junction 126, wherein magnetic tape 100 is affixed to single reel 110 of magnetic tape cartridge 301. A length of trailer tape 109 may be interposed between the physical end of tape 125 and tape to hub junction 126. This serves as a method of wrapping magnetic tape 100 around the reel 110 in order to provide a method of attachment thereto and also includes an end of tape hole 124 which indicates to tape drive subsystem 300 that an end of the magnetic tape 100 has been reached.

Internal Leader Header

The internal leader header 105 consists of administrative information which typically includes:

Data Record Directory
    Logical block locations
Administrative Information
    Location of last Data Scan group written
    Number of volume loads
    Number of read/write errors for the last n mounts
    Serial number of last m drives upon which this cartridge was mounted
    Volume ID
    Time and data stamp of mount
    Tape type and length
    Safe File information
Manufacturer's ID and Production Batch Numbers The internal leader header segment 105 of magnetic tape 100 is read on every load of magnetic tape cartridge 301 into a tape drive subsystem 300. The internal leader header segment 105 is updated by magnetic tape drive subsystem 300 prior to magnetic tape 100 being physically unloaded therefrom in order to update the header information concerning read and write information contained therein. The internal leader header 105 illustrated in FIG. 5 includes two segments: administrative information 501, and data record search directory 502. The data record search directory 502 includes a plurality of entries (502-1 to 502-n), one for each search segment boundary that is crossed.

In addition, the data that is recorded on magnetic tape 100 is divided into super groups, each of which comprise up to 24 scan groups of data with an appended ECC scan group. These super groups of data are written on to the magnetic tape 100 via the search segments, with super groups of data, due to their variable size, and not necessarily beginning at a search segment boundary. The search segments are 32 scan groups in length. Thus, the location of a particular data record can be determined from the physical scan group count of the start of the super group.

Data Record Directory

Each directory entry 502-* includes the information illustrated in FIG. 6 and written by the apparatus illustrated in FIG. 4. In fact, the apparatus of FIG. 4 can be software elements located in tape drive control unit 350 used to create a scan group 700 for internal leader header 105. The first element in the entry is a physical scan group count 601 of four bytes length stored in element 2602 which represents a unique physical location on magnetic tape 100. Since each search segment contains a fixed number of scan groups 700 written on to magnetic tape 100, the location of a specific scan group within the selected search segment is a simple process of positioning the magnetic tape 100 a calculated distance from the beginning of tape point. The second element contained in the entry is a file identification number 602 of three bytes created by element 2603 and which identifies a numerical file in which scan group 700 is contained. The file identification 602 is used internally in tape drive subsystem 300. The file identification 602 is also termed file marks or tape marks and are sent from the host processor 1 and are used to separate data. This file ID number 602 provides a scan group to file correspondence in order to simplify the administering of the data within files on magnetic tape 100. The third element contained in the entry is a logical block number of first starting host processor data packet within a super group 603, which is a five byte long field created by element 2601. This block number identifies the first data group of a super group that follows the search segment boundary. The final element in the entry is a reserved field 604 of twenty bytes for future use as to be determined for future elements 2604.

Administrative Information

FIG. 10 illustrates the information typically contained in the administration information section 501 of internal leader header 105. A first segment of information contained in internal leader header 105 is the volume identification 1001 which consists of 80 bytes created by element 2101 that represent the volume identification number assigned to magnetic tape cartridge 301. A second section of administrative information 501 is the tape type and length, which is a one byte long field created by element 2102 to indicate the type of media and its length. A third segment 1003 of administrative information created by element 2103 is the tape manufacturer's identification and production batch number, which consists of 128 bytes of information, to provide the user with information concerning the date of manufacture of this magnetic tape cartridge as well as the identification of the manufacturer and their particular production batch number. This information assists the user in identifying media that has been recalled by the manufacturer or media of a certain class that is more prone to errors than other similar types of media.

Further entries that are optionally included in administration information 501 are tape usage statistics 1004 created by element 2104 indicative of the number of times that magnetic tape cartridge 301 has been loaded on tape drive subsystem 300 and the number of read and write cycles magnetic tape 100 has been subject to. These usage statistics can include the serial number of tape drive subsystem 300, as well as date and time stamps to record load activity. Another entry 1005 is a recording type byte created by element 2105 to indicate write-without-retry or file safe status of magnetic tape 100. Further information includes error data 1007 created by element 2107, including a record of the number of read/write errors detected and corrected in the last n times the magnetic tape is mounted on a tape drive as well as the identification of the tape drives upon which this magnetic tape was mounted. The error data 1007 includes a collection of all the error statistics that are produced during the last n mounts in order to enable host processor 1 to access this information in order to determine whether magnetic tape 100 is flawed or whether the associated tape drive subsystem 300 on which is was mounted is experiencing regular failures. Finally, additional memory is provided for future use to enable magnetic tape 100 to store predefined information, either selected by the user or defined by the tape drive manufacturer.

Data Format of the Helical Scan Magnetic Tape

Figure 2:
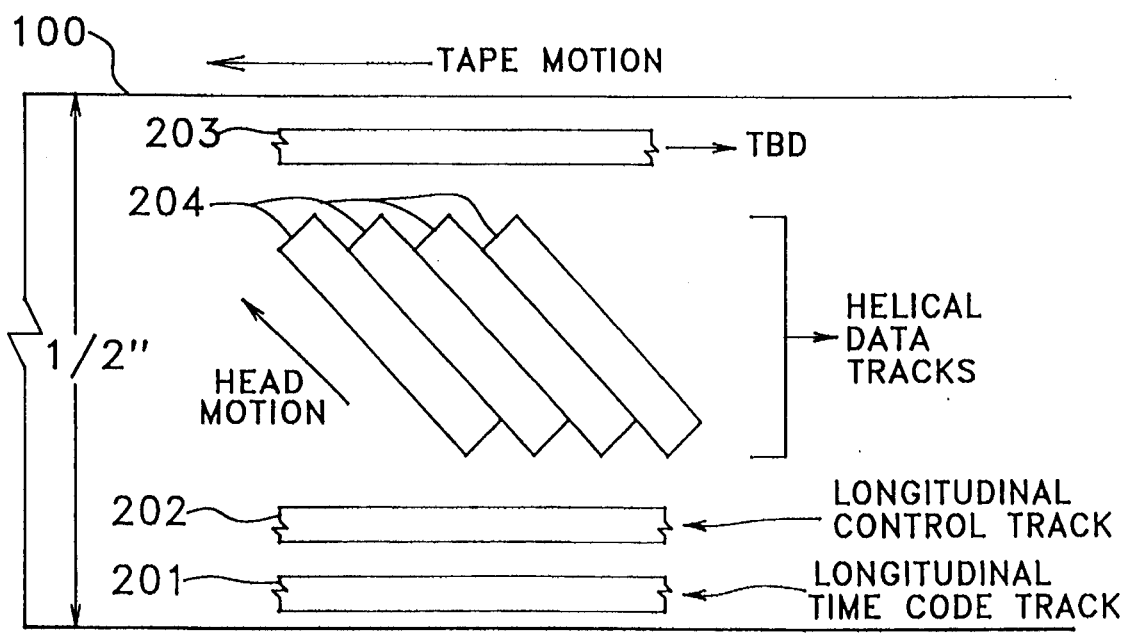
FIG. 2 illustrates the data recording format of helical scan magnetic tape.
Figure 7:
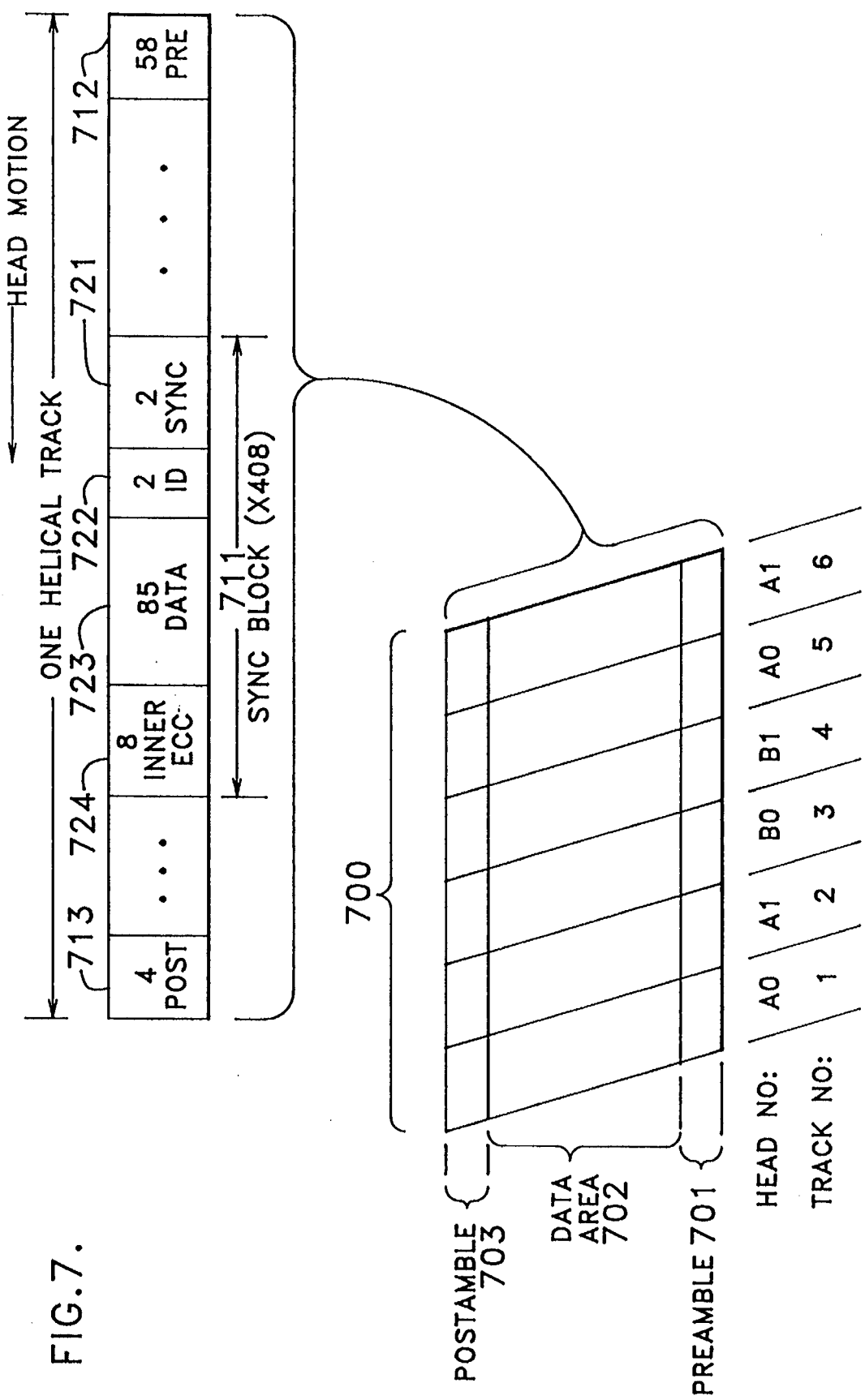
FIG. 7 illustrates details of the data recording format of the helical scan magnetic tape.

FIGS. 2 and 7 illustrate the data recording format of helical scan magnetic tape 100 used herein. The scan group 700 is the basic unit for formatting data on magnetic tape 100. As two adjacent write heads 321 of scanner 320 move across magnetic tape 100, two helical tracks 204 of data are simultaneously written on to magnetic tape 100. Once scanner 320 has completed one half of a revolution, the other pair of write heads 321 begins to write the next two adjacent tracks 204 on to magnetic tape 100. One and a half revolutions of scanner 320 produce the six tracks (1–6) illustrated in FIG. 7 to complete a single scan group 700. As can be seen from FIG. 7, a postamble 703 and preamble 701 are written on either end of the data area 702 of each track 204 written on to magnetic tape 100 in order to enable read heads 322 to accurately read the data contained therein.

In addition, the data format of a single helical track is illustrated in FIG. 7 to note that preamble data begins a track on magnetic tape 100 and postamble data ends a track on magnetic tape 100. Interposed between preamble 712 and postamble 713 are 408 sync blocks 711, each of which contain eighty-five bytes of user data 723. In addition, two synchronization bytes 721 are prepended to data 723 along with two identification bytes 722. Eight bytes of inner error correcting code 724 are appended to the end of data 723 in order to complete the format of sync block 711. The inner ECC code 724 illustrated in FIG. 7 covers both data 723 and identification 722 but not synchronization bytes 721 contained in sync block 711. Therefore, a 95, 87 Reed Solomon code is formed to detect errors contained in data 723 and identification 722 fields of sync block 711. The sync pattern 721 portion of sync block 711 is a fixed pattern of data bits used to resynchronize the read clock and logic after dropouts. Of the 408 sync blocks 711 in a single track 204, twenty-four are used at the start of track 204 for outer ECC check bytes (described below). Therefore, there are (408–24)×85=32,640 bytes per track 24 of user data 723. With six tracks 204 per scan group 700, a scan group 700 therefore contains 195,840 bytes of user data 723.

FIG. 9 illustrates the positioning information recorded on the magnetic tape 100. The basic unit used to transfer data from the host processor 1 to magnetic tape 100 is the data block 901, which is analogous to a conventional data record. Each data block 901 sent by the host processor 1 to be written to magnetic tape 100 is sequentially assigned a unique block number by the tape drive control unit 350. Data blocks 901 are logical entities which may have different lengths, unlike fixed length blocks which are required by some prior art magnetic recording systems. A data block 901 may be larger than a physical scan group 700, and may also span two or more adjacent scan groups 700. Since each physical scan group 700 is the same size, the variable size of the data blocks 901 is transparent to the tape drive control unit 350 when a high speed data block search is conducted using the longitudinal track servo information in conjunction with the scan group location in the internal leader header 105.

Data block IDs are noted for each search segment in the internal leader header 105 in order to provide a mechanism for increasing the speed of a search, and for verifying the location of the contiguously stored data block 901. These data block IDs are referred to as "host block IDs" since the data block 901 is the basic unit used by the host processor 1 to write data to magnetic tape 100. Scan group 904 boundaries are locatable via the servo control track 202 at a 60× or 100× search speed. Furthermore, the placement of block IDs in scan group headers provides a verification of the correctness of a search to a particular search segment 904 wherein a block having a predetermined (expected) ID is expected to be found. The scan group header included in the scan group 700 typically includes the following information:

| | | |
|---|---|---|
| 1. Type of scan group | 1 byte | |
| 2. Logical scan group number | 4 bytes | |
| 3. Beginning host block ID (Block ID of byte 0) | 5 bytes | |
| 4. Ending host block ID (Block ID of last byte) | 5 bytes | |
| 5. File ID number | 3 bytes | |
| 6. Number of pad bytes in logical scan group | 3 bytes | |
| 7. Information data byte: >--> File safe bit Write-without-retry bit | 1 byte | |
| 8. Continuation Information: >--> First host block continued from previous scan group bit Ending host block continues into next scan group bit | 1 byte | |
| 9. Scan group CRC | 2 bytes | |
| 10. Scan group header CRC (fixed) | 2 bytes | |
| 11. Pointer to first packet that begins in this scan group | 3 bytes | |
| 12. Variable Information: Physical Scan Group Count rewrite Count Variable CRC | 4 bytes 1 byte 2 bytes | |
| 13. If an ECC group, the number of data groups covered by this ECC. If a data group, the sequence number within this ECC super-group. | 1 byte | |
| 14. Miscellaneous information | 18 bytes | |
| SUB TOTAL | 56 | |
| RESERVED | 72 | |
| TOTAL | 128 | |

Longitudinal Tracks

The tape format for helical scan recorded magnetic tape 100 includes three longitudinal tracks 201–203 written on magnetic tape 100: servo control track 202, time code track 201 and one track 203, the use of which is to be determined. The servo control 202 and time code 201 tracks are located at the bottom of magnetic tape 100 while the unused track 203 is located at the top of magnetic tape 100. The servo control track 202 is recorded as helical tracks 204 are written onto magnetic tape 100 and contains pulse edges that mark the location of each helical track pair written on to magnetic tape 100. One use of servo control track 202 is to synchronize, during playback, the rotation of scanner 320 with the position of helical tracks 204 on magnetic tape 100. The time code track 201 is recorded as helical tracks 204 are written on to magnetic tape 100. The time code track 201 contains location information that uniquely identifies each scan group pair 700 on magnetic tape 100. Similar location information is contained in the helical tracks 204 themselves, but the longitudinal time code track 201 can be read at a higher tape speed, i.e., at 60× normal recording speed. This information can be used to position magnetic tape 100, while being transported at a 60× or 100× normal recording speed, to a specified scan group 700, based on scan group location information contained in the data record directory section 502 of internal leader header 105.

The various high speed search operations of the present invention are used to position a particular physical location on magnetic tape 100 under the read/write heads 321, 322 of scanner 320 in a significantly faster time and to a more accurate location than prior art methods. These prior art methods include positioning the tape to an approximate location of a desired data block, or, less efficiently, searching for the desired data block by performing a continuous read operation until the data block is located.

The servo system in a typical tape drive such as that used by the present method is capable of performing a high speed search to a scan group 700 which can be located via time code track 201 on magnetic tape 100. The servo can locate a particular area consisting of a group of twelve helical tracks 204 or two scan groups 700. By using longitudinal time code track 201, tape drive subsystem 300 can perform a high speed search at 60× or 100× normal recording speed to within two scan groups containing the data record that is requested. This is a much finer resolution than can be obtained by using a simple but less accurate distance measurement employed by prior art physical data identification techniques.

Write Data Path

Figure 8:
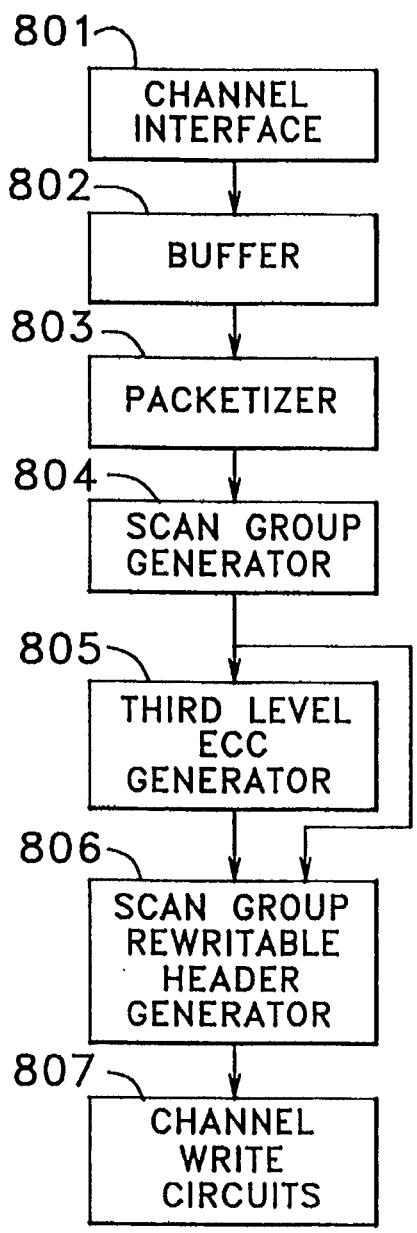
FIG. 8 illustrates in block diagram form the architecture of the write data path in the tape drive control unit.
Figure 14:
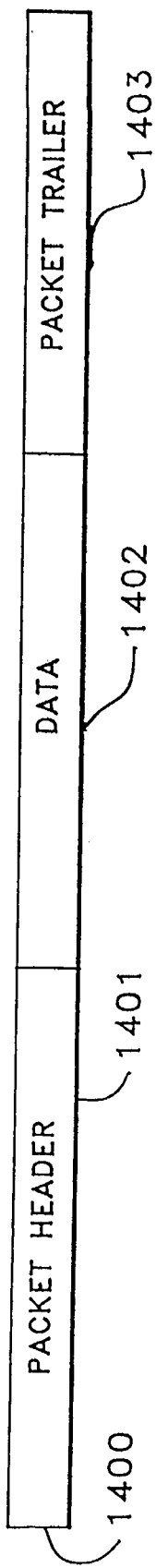
FIGS. 14–16 illustrates various aspects of the data formats.
Figure 15:
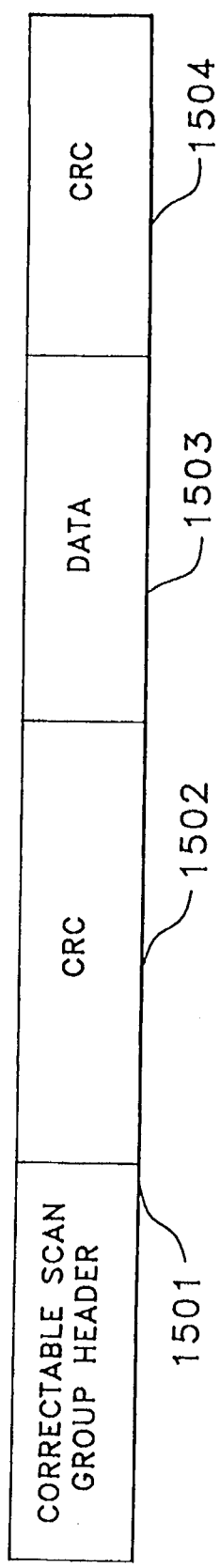
Figure 16:
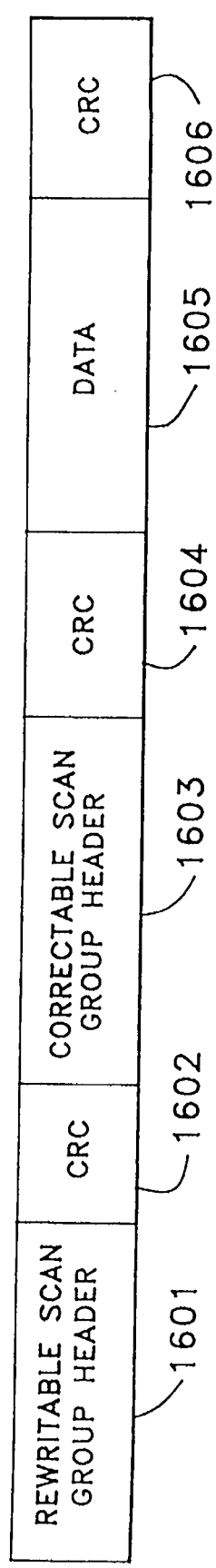

FIG. 8 illustrates in block diagram form the architecture of the write data path contained within tape drive control unit 350 while FIGS. 14–16 illustrate data formats used therein. The write data path includes a channel interface circuit 801 which interconnects tape drive control unit 350 with data channel 2 from host processor 1. Channel interface circuit 801 receives data blocks from host processor 1 and stores them in buffer 802 for processing by the hardware and software contained in tape drive control unit 350. Buffer 802 stores a predetermined amount of data that is received from host processor 1. A typical buffer size is 16 Mb or greater in order that host processor 1 can write a significant amount of data into tape drive control unit 350 without requiring interruption of the data transfer caused by the movement or delay in movement of the magnetic tape 100 on tape drive 300.

Packetizer circuit 802 receives data from channel interface 801 and packetizes the data 1401 as shown in FIG. 14 by adding a packet header 1402 which is protected by a cyclic redundancy check (CRC) (not shown). Data records received from host processor 1, whose block size do not exceed 262K bytes, are followed by a packet trailer 1403 and a CRC (not shown) which protects both data 1401 and packet trailer 1403. The packets 1400 produced by packetizer 803 are transmitted to buffer 803 for use by scan group generator 804 which reformats the packetized data 1400 by concatenating them into scan groups 1500 as shown in FIG. 15. If a scan group data field is incomplete, pad bytes are added to the scan group data field 1503 as required to complete the scan group data field 1503. A fixed scan group header 1501 and a two byte CRC character 1502 are then prepended to the scan group data field 1503 and a CRC code 1504 also appended thereto. The partial scan group 1500 thus generated is transmitted to third level ECC generator 805 which Exclusive ORs (for example) twenty-four scan groups 1500 to produce a third level ECC scan group. In addition, the scan groups 1500 are concurrently transmitted to variable scan group header generator 806 which produces, as shown in FIG. 16, a variable scan group header 1601 and CRC code 1602 which protects this rewriteable scan group header 1601, both of which are prepended to the scan group 1500. The resultant data 1600 is then transmitted to the channel write circuits 807 for writing the data in helical scan format on to magnetic tape 100.

Tape Read Operations

The search segment is used to make search entries in the header. The size of the search segment is a predetermined number of scan groups, typically 32 scan groups. The count indicative of the position of the first data group of a super group within a particular search segment is entered into the directory.

In reading a data record from the magnetic tape, the first data group of this data record may occur earlier or later on the magnetic tape than the location identified in the directory. The actual location of the start of the data record can legitimately be later due to write skips as disclosed herein, since a later version of this scan group may be the one that is to be read. However, the scan group should not occur earlier on the magnetic tape or later than a reasonable number of scan groups unless the directory entry is invalid. When an entry in the directory is found to be invalid, then the integrity of the entire directory is in question and the directory is considered invalid in its entirety.

Video Data Format

The tape drive subsystem 300 in conjunction with video-to-data converter C functions as a digital video tape recorder which uses a ½" magnetic tape as the data storage medium and uses a digital recording format as described above, which is compatible with the presently used NTSC and PAL (525/60 and 625/50 lines/inch and frames per minute) video broadcast standards. The digital format of the recording, using data processing quality error detection and correction techniques enables all digital video acquisition, post production processing in a studio environment, unlimited reproduction and transmission without signal degradation. It is expected that this system will be compatible with future high definition television (HDTV) standards and requirements in terms of data rate and quality. In contrast, analog video tape restricts the number of derivative copies that are created since the signal to noise ratio and bandwidth available to create successive copies is reduced. Analog video tapes accumulate errors in successive copies, thereby degrading performance for each successive copy produced. Digital recording techniques provide error detection and correction to produce flawless copies, regardless of the number of successive copies manufactured.

The two basic operating modes of tape drive subsystem 300 are:
1. Recording and playback of 48 KHz digital audio and 13.5 MHz sample rate digital video in full 10-bit component form in both NTSC and PAL format. In this mode, the digital video data recorder must interface with a 270 Mbps serial digital stream of data from the video source.
2. Recording and playback of digital composite audio and video at a sample rate of 18 MHz in full 10-bit form.

Figure 17A:
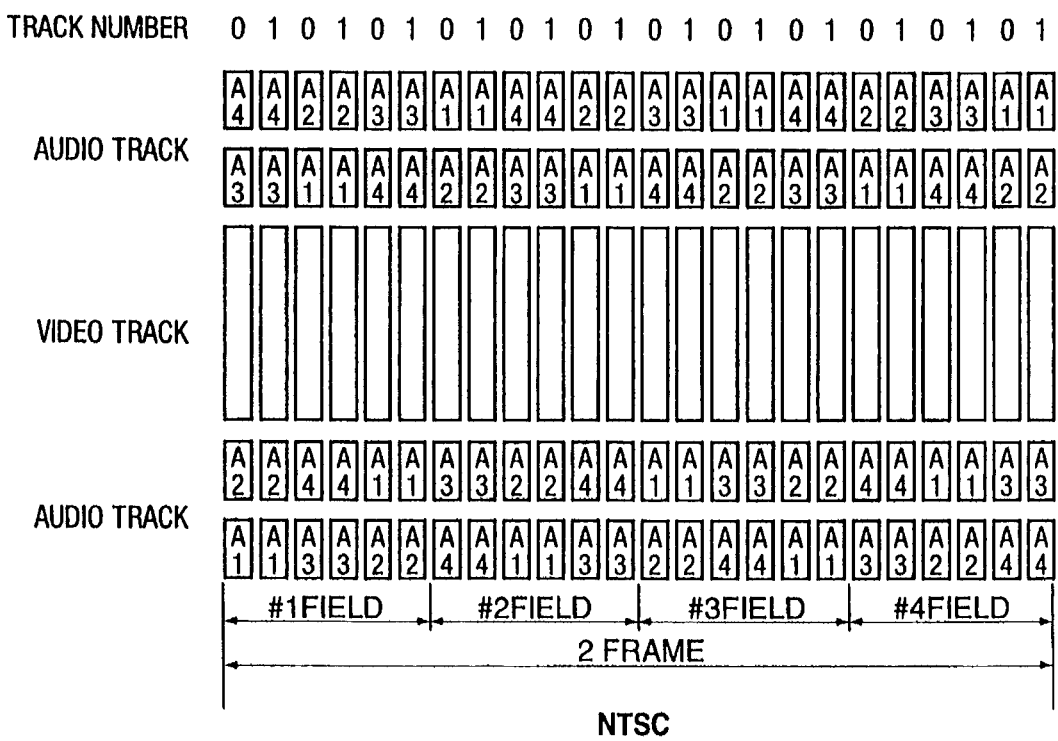
FIG. 17 illustrates data formats of the video data.
Figure 17B:
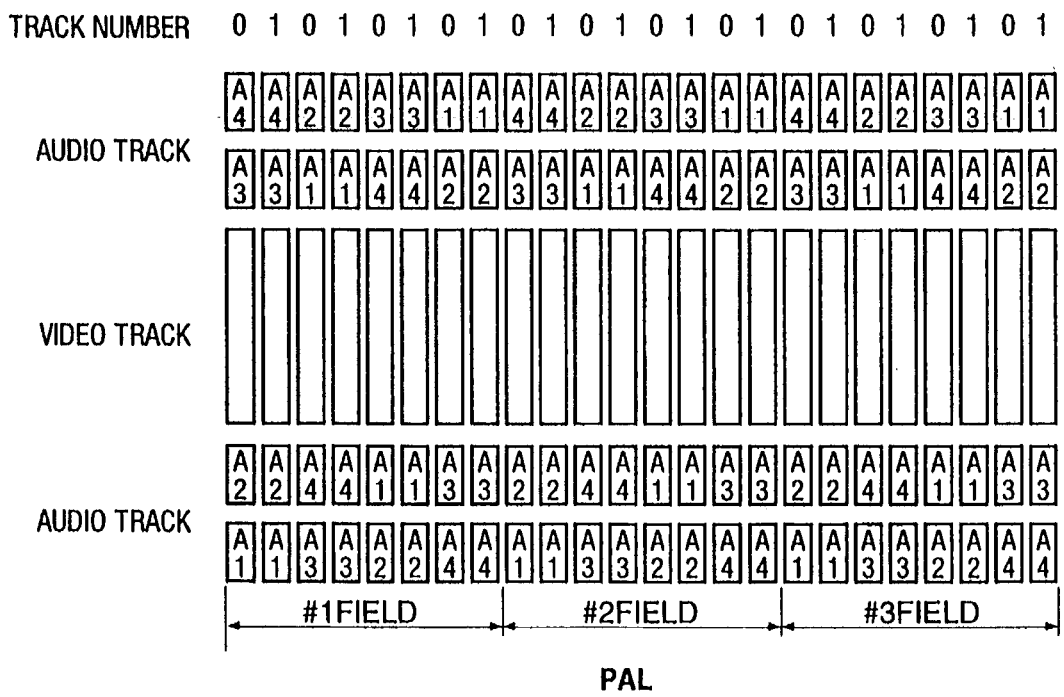

FIGS. 17A and 17B illustrate the difference between the NTSC and PAL formats in that NTSC comprises four fields per twenty-four tracks while the PAL format comprises three fields per twenty-four tracks. This diagram also illustrates the sequencing of the four audio tracks in the four audio sectors on each track.

Interface Architecture

Figure 18:
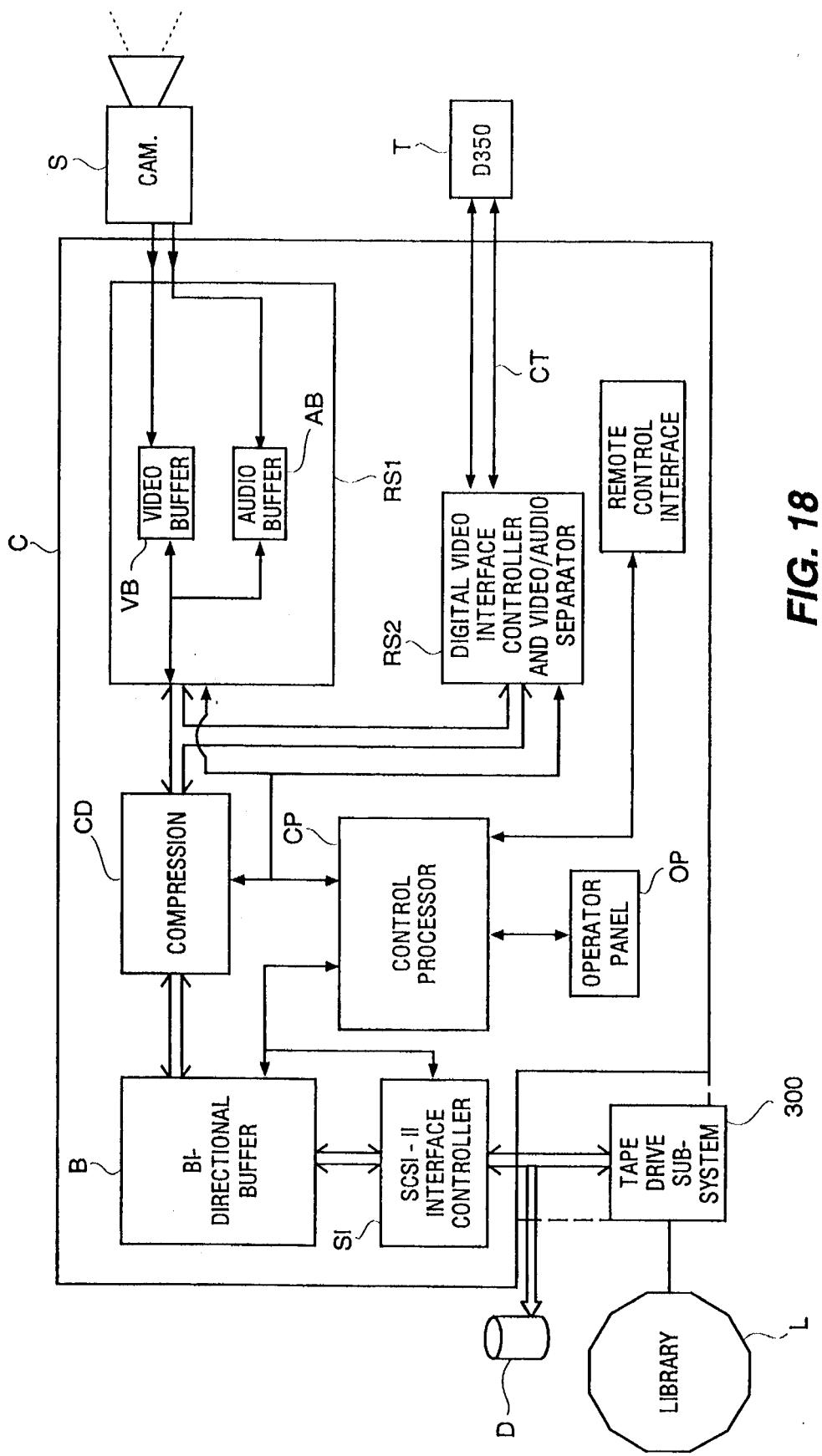
FIG. 18 illustrates in block diagram form the architecture of the video-to-data converter.

FIG. 18 illustrates in block diagram form the system interconnection of the apparatus of the present invention. This apparatus, in the preferred embodiment, comprises a video-to-data converter C that is connected between the data read/write device (tape drive subsystem 300 and/or disk drive D) and the source of video data S. The video-to-data converter C can be an independent element interposed between the video source S and a stand alone tape drive subsystem 300, or can be incorporated into the tape drive subsystem 300 as an integral element thereof (as illustrated by the dotted lines that extend the boundaries of tape drive subsystem 300 on FIG. 18).

The video data can be obtained from any of a number of possible sources, including a digital camera S that converts an object located within its field of view into a digital representation of the object image. The object can be paper records, live action subjects, etc. Alternatively, the video source can be a digital video data recorder R, which outputs digital signals representative of a prerecorded series of images. The video-to-data converter C interfaces with a data storage device, such as digital tape drive subsystem 300, that operates to store data in helical scan form on a magnetic tape 100 that is wound on a single reel, rotatably mounted within a 3480-type tape cartridge housing. The tape drive subsystem 300 can interface with an automated magnetic tape cartridge library L for robotic storage of a plurality of media elements (magnetic tape cartridges) in a plurality of data storage locations (not shown). The robotic library system L transports the tape cartridges between the data storage element locations and the tape drive subsystem 300, where they are mounted therein by the robotic library system L.

The video data can also be stored on a higher speed random access rewriteable media, such as disk drive D (or disk drive array). The disk drive D can also be used to stage data retrieved from tape drive subsystem 300 or received from video-to-data converter C. Thus, the tape drive subsystem 300 (and library L) can be the master repository of the digital video data, stored in data record form, while the disk drive D provides a temporary repository for this digital-video data as the data bytes are transferred between tape drive subsystem 300 and source S or a playback device (not shown) or video tape recorder T.

The overall architecture of the video-to-data converter C is illustrated in block diagram form in FIG. 18. The video-to-data converter C includes at least one, and possibly a plurality of interface controllers and formatter separators FS*, each of which interconnects one of the plurality of digital video sources S, R to the bidirectional buffer B. FIG. 18 illustrates two interface controller and formatter separator circuits FS* as included in video-to-data converter C. A first interface controller and formatter separator circuit FS1 interconnects video-to-data converter C with a digital video camera S. A second interface controller and formatter separator circuit FS2 interfaces video-to-data converter C with a digital video tape recorder R.

Each interface controller and formatter separator circuit FS* includes the elements that are illustrated in FIG. 18. The interface controller and formatter separator circuit FS1 receives the digital video input signal from the associated source device (video camera S, for example) and stores the audio and video components from the received digital signal and stores these components in an audio buffer AB and a video buffer VB, respectively in order to modify the format of the received signal into a format that is compatible with the data storage format of the magnetic tape medium on which this data is scheduled to be written.

The input data is quantized PCM encoded data at 10-bits per sample. Control processor CP is connected via control signal leads to all elements contained within video-to-data converter circuit C. In particular, one set of control signal leads interconnect control processor CP to the plurality of interface controller and formatter separator circuits FS*, as well as the optional compression-decompression circuit CD. A second set of control signal leads interconnect control processor CP with bidirectional buffer B and SCSI-II Interface circuit SI. An operator panel OP and remote control interface (not shown) can also be included to provide human input/remote input to regulate the operation of the video-to-data converter circuit C via control processor CP.

A compression circuit CD is optionally provided in video-to-data converter circuit C to enable control processor CP to select a particular compression algorithm to operate on the received digital data that is transmitted from a selected interface controller and formatter separator circuit FS* to bidirectional buffer B. The compression-decompression circuit CD can have stored therein a plurality of algorithms to enable the video-to-data converter circuit C to operate with various video storage schemes.

Control processor CP activates a selected interface controller and formatter separator circuit FS1 to output the data stored in the audio and video buffers (AB, VB) to bidirectional buffer B. The control processor CP activates audio buffer AB to output the audio data that is associated with the video frame to bidirectional buffer B. The control processor CP then disables audio buffer AB and enables video buffer VB to output the entire video frame of data to bidirectional buffer B. Once the video data has been output, control processor CP disables video buffer VB and again activates audio buffer AB to output the remaining audio data from audio buffer AB to bidirectional buffer B. This process continues on a frame by frame basis. The transmitted data is then output from bidirectional buffer B to SCSI-II interface controller SI, which regulates the timing of the data that is output from bidirectional buffer B and forwards this data to the tape drive subsystem 300 in 16-bit bytes for writing on to the data storage medium. The data that is output to the tape drive subsystem 300 can be in the format illustrated in FIG. 17 or any other selected format, such as video data followed by associated audio data or vice versa. The tape drive subsystem 300 writes the received and formatted data onto each helical scan track in the selected orientation and format using a data record storage format. In order to fit the entire frame of video, including both the audio and video data, in a reasonable number of helical scan tracks, the data can be compressed. The tape drive subsystem 300 therefore can include a data compression-decompression circuit as part of control unit 350 that takes the data stream output by the SCSI-II interface controller SI and compresses this data pursuant to well-known data compression algorithms. The resultant compressed data is than stored in the helical scan tracks and additional pad bits added thereto if necessary to store the data in an integral number of tracks. This enables the tape drive subsystem 300 to store each video frame as a separate easily managed data record on the magnetic tape, so that the video frame can be individually accessed for data retrieval by simply retrieving the data record into which it is now stored on the magnetic tape.

There is typically a speed mismatch between the digital video source S and the tape drive subsystem 300 and bidirectional buffer B can assist in compensating for the mismatch, but the video-to-data converter C also includes the capability to signal the digital video source via a control lead CT to temporarily halt transmission. Alternatively, the control processor CP can disable the audio and video buffers AB, VB to not accept further input until the already received signals have been processed. In document archival applications, the control processor CP enables the video buffer VB once for each document that is presented to the digital video source S and stores the resultant image. The speed of operation in this application is such that the tape drive subsystem 300 is able to record images as fast as the documents can be presented to digital video camera S. In prerecorded video applications, the digital video source, comprising digital video tape drive T, outputs data at a rate that is in excess of the operating speed of the tape drive subsystem 300 due to the data compression-decompression operation and the error detection and correction operation that is used within tape drive subsystem 300. Thus, control processor CP signals digital tape recorder T via signal lead CT to pause the operation of the digital tape recorder T once bidirectional buffer B is filled and tape drive subsystem 300 must process the data stored therein before the digital tape drive T is enabled to transmit data to video-to-data converter C. As noted above, the data can also be staged via disk drive D to compensate for this difference in speed of operation.

Data Record Write to Magnetic Tape

Figure 11:
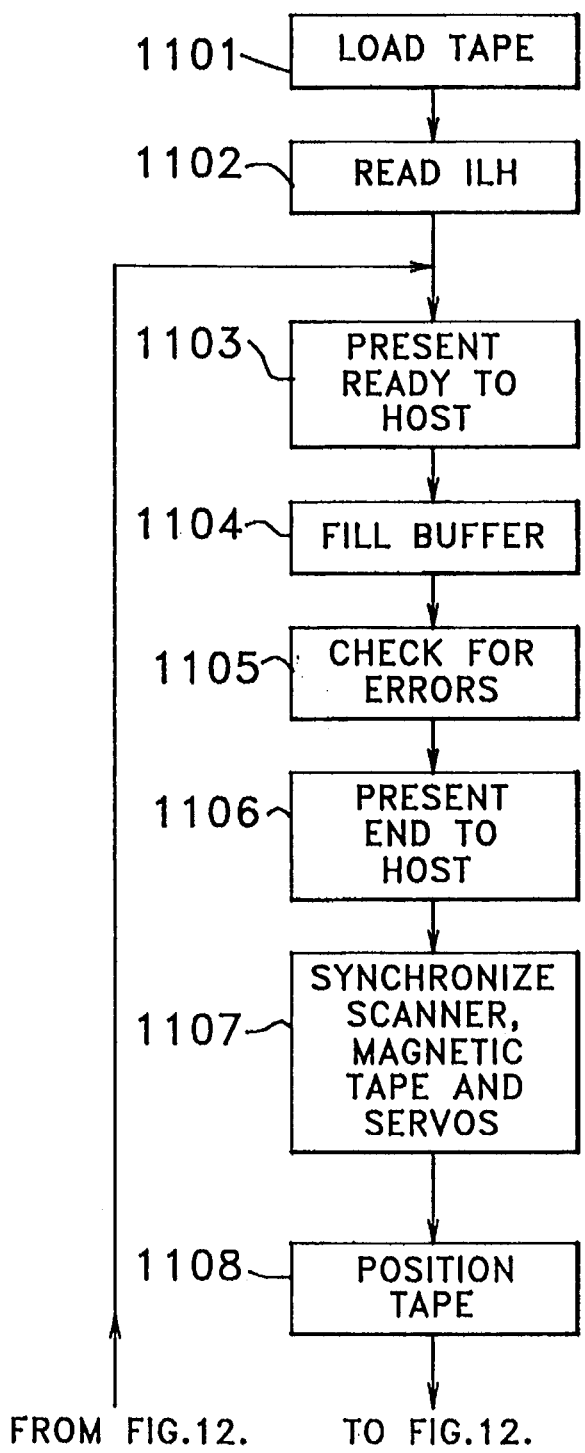

FIGS. 11–13 illustrate in flow diagram form the operational steps taken by tape drive 300 to write data in helical scan form on magnetic tape 100. At step 1101, a magnetic tape cartridge 301 is inserted into tape drive 300 and the tape drive mechanism illustrated in FIG. 3 loads the magnetic tape 100 by threading the leader block 101 and magnetic tape 100 through the tape threading path to the takeup reel 360 which rotates around spindle 361. At step 1102, magnetic tape 100 is advanced forward in order to enable the tape drive control unit 350 to read the internal leader header 105 written on to this magnetic tape 100 via read heads 322 of scanner 320. If this tape is an blank tape, there is no internal leader header 105 on this magnetic tape 100. If the tape has been previously used, the internal leader header 105 contains the information described above and enables tape drive control unit 350 to determine where on magnetic tape 100 the data records have been written. At step 1103, tape drive control unit 350 presents a ready signal to host processor 1 indicating that tape drive subsystem 300 is ready to receive data and commands from host computer 1 via data channel 2. At step 1104, host processor 1 transmits data over data channel 2 that interconnects it to tape drive 300 and the data is written into buffer 803. As the data is written into buffer 803, tape drive control unit 350 checks for errors to make sure there are no transmission errors in the data received from host processor 1. Since tape drive subsystem 300 can typically write data to magnetic tape 100 faster than host processor 1 can write the data into buffer 803, tape drive control unit 350 waits at step 1105 for host processor 1 to complete its data transmission and checks for errors. At step 1106 tape drive subsystem 300 presents the proper ending status to host processor 1 indicating that the data records have been written into buffer 803. When buffer 803 is filled to a predetermined level, tape drive subsystem 300 begins writing the data to magnetic tape 100 in order to free up more buffer space for host processor 1 to continue writing data records therein. At step 1107 tape drive control unit 350 ensures that scanner 320, magnetic tape 100 and servos (not shown) are all synchronized. At step 1108, the control unit 350 positions magnetic tape 100 to the physical location on magnetic tape 100 where writing is to begin. At step 1109, control unit 350 prepares the appropriate scan group 700 to be written. For the purpose of this description, assume that the scan groups written to magnetic tape 100 represent data records received from host processor 1 and stored in buffer 803. As described above, third level ECC scan groups are periodically written into the stream of data records to form super groups which are written on magnetic tape 100. At step 1110, control unit 350 activates the read/write mechanism described above to write the scan group to magnetic tape 100 and at step 1111, the read after write process reads scan groups 700 as they are written on to magnetic tape 100 in order to ensure their integrity. If an error is detected in the written scan group, the scan group is rewritten further along magnetic tape 100 at step 1116. At step 1112, control unit 350 checks the buffer status and at step 1113 determines whether further data is in buffer 803. If data is in buffer 803, steps 1109–1113 are repeated until, at step 1113, no more data is available from buffer 803. Control unit 350 determines at step 1114 whether more data is expected from host processor 1. At this point (step 1117), control unit 350 writes a plurality (typically four) of pad groups and end groups after the last written scan group in order to complete the writing of this stream of data records. At step 1118, magnetic tape 100 is rewound to its beginning and, at step 1119, data record directory 502 is updated with information concerning the physical location and identity of the data records that have just been written onto magnetic tape 100. At step 1120, control unit 350 updates the administrative information section 501 of internal leader header 105. This information is described above and entails elements 2601–2604 and 2101–2108 being sequentially activated and their outputs multiplexed by multiplexer 2201 into buffer 802 to form a scan group for internal leader header 105. The elements disclosed in FIG. 4 can be registers in control unit 350, software routines that execute in control unit 350, memory entries in the memory (not shown) that is part of control unit 350, etc. Suffice it to say that the nature of the data created by each of elements 2601–2604, 2101–2108 determines the implementation of the corresponding element. Multiplexer 2201 represents the element in control unit 350 that formats all the data created by elements 2601–2608, 2101–2108 into the formats illustrated in FIGS. 6 and 10. Again, it is expected that multiplexer 2201 may be a software element within control unit 350 that formats the data created by elements 2601–2608, 2101–2108 into data record directory 502 and administrative information 501 sections of internal leader header. Thus, on an initial load of magnetic tape 100, the internal leader header 105 is read and the data contained therein is read into elements 2601–2608, 2101–2108 as illustrated by the inputs on the left side of FIG. 4 to each of the elements 2601–2608, 2101–2108. During the use of magnetic tape 100, many of these data entries are updated, supplemented and/or modified until control unit 350 rewrites internal leader header 105, at which time the data contained in and generated by elements 2601–2608, 2101–2108 is used to populate internal leader header 105, which is then written on magnetic tape 100 at step 1121. At step 1122, the tape write operation is completed and magnetic tape 100 can be unloaded or positioned ready for subsequent data record writes. If, at step 1114, control unit 350 determines that further data is expected from host processor 1, control unit 350 at step 1115 writes a plurality of pad scan groups following the end of the last written data scan group and rewinds magnetic tape 100 to the end of the first of these pad scan groups. Control unit 350 then returns to step 1103 and presents a ready status to host processor 1.

While a specific embodiment of this invention has been disclosed, it is expected that those skilled in the art can and will design alternate embodiments of this invention that fall within the scope of the appended claims.

We claim:

1. An interface that interconnects a data processor data storage element, which reads and writes a stream of data records on a rewriteable medium mounted in said data storage element, and a source of video data that produces a sequence of frames of digital video data in a predetermined format, each of which frames of video data includes an audio component and a video component, comprising:

means for storing said audio component that is contained in said video data received from said source of video data;

means for storing said video component that is contained in said video data received from said source of video means for reformatting said stored audio and video components into a data record format, wherein each data record contains audio and video component data that comprise an individual one of said sequence of frames of video data;

means for writing each said data record in said sequence seriatim in a predefined segment of said rewriteable medium;

means for generating data record location information which indicates a physical location on said rewriteable medium at which each said data record is written; and means for storing said data record location information to enable said data storage element to uniquely locate each date record stored on said rewriteable medium.

2. The apparatus of claim 1 wherein said writing means comprises:

means for segmenting said rewriteable medium into a first segment for storing administrative data and a second segment for storing said data records.

3. The apparatus of claim 2 wherein said first segment is prepended to said second segment on said rewriteable medium.

4. The apparatus of claim 1 wherein said rewriteable medium comprises a magnetic tape.

5. The apparatus of claim 4 wherein said first segment and said second segment are written in helical scan format on said magnetic tape.

6. The apparatus of claim 2 wherein said rewriteable medium comprises a magnetic tape, further comprising:

means for inserting said data record location information into said administrative data to identify said physical location of said data record on said magnetic tape;

means for inserting media information into said administrative data to identify media characteristics; and means for writing said administrative data in said first segment of said magnetic tape.

7. The apparatus of claim 6 wherein said data record location inserting means comprises:

means for segmenting said magnetic tape into a plurality of search segments, each representative of a predetermined number of tracks written on said magnetic tape.

8. The apparatus of claim 7 wherein said data record location inserting means further comprises:

means for identifying one of said search segments in which a received data record is written on said magnetic tape; and means for inserting data, indicative of said identified search segment, into said administrative data.

9. The apparatus of claim 8 wherein said data record location inserting means further comprises:

means for writing data, indicative of a number of tracks following a boundary of said identified search segment to which said data record begins, into said administrative data.

10. The apparatus of claim 6 wherein said rewriteable medium comprises a magnetic tape, said data record location inserting means comprises:

means for writing last data record location data into said administrative data to indicate the physical location on said magnetic tape of an end of a last written data record contained on said magnetic tape.

11. The apparatus of claim 6 wherein said rewriteable medium comprises a magnetic tape, said media information inserting means comprises:

means for writing data indicative of amount of use of said magnetic tape into said administrative data.

12. The apparatus of claim 6 wherein said rewriteable medium comprises a magnetic tape mounted on a data storage element which comprises a tape drive, said media information inserting means comprises:

means, responsive to said tape drive detecting a media failure, for writing media failure data into said administrative data to record a history of media failures.

13. In a system that comprises an interface that interconnects a data processing data storage element, a method which reads and writes a stream of data records on a rewriteable medium mounted in said data storage element, and a source of video data that produces a sequence of frames of digital video data, each of which frames of video data includes an audio component and a video component, comprising the steps of:

storing said audio component that is contained in said video data received from said source of video data;

storing said video component that is contained in said video data received from said source of video data;

reformatting said stored audio and video components into a data record format, wherein each data record contains audio and video component data that comprises an individual one of said sequence of frames of video data;

writing each said data record in said sequence seriatim in a predefined segment of said rewriteable medium;

generating data record location information which indicates a physical location on said rewriteable medium at which each said data record is written; and storing said data record location information to enable said data storage element to uniquely locate each data record stored on said rewriteable medium.

14. The method of claim 13 wherein said step of writing comprises:

segmenting said rewriteable medium into a first segment for storing said administrative data and a second segment for storing said data records.

15. The method of claim 14 wherein said first segment is prepended to said second segment on said rewriteable medium.

16. The method of claim 13 wherein said rewriteable medium comprises a magnetic tape.

17. The method of claim 16 wherein said first segment and said second segment are written in helical scan format on said magnetic tape.

18. The method of claim 14 wherein said rewriteable medium comprises a magnetic tape, further comprising the steps of:

inserting said data record location information into said administrative data to identify said physical location of said data record on said magnetic tape;

inserting media information into said administrative data to identify media characteristics; and writing said administrative data in said first segment of said magnetic tape.

19. The method of claim 18 wherein said rewriteable medium comprises a magnetic tape, said step of data record location inserting comprises:

segmenting said magnetic tape into a plurality of search segments, each representative of a predetermined number of tracks written on said magnetic tape.

20. The method of claim 19 wherein said rewritable medium comprises a magnetic tape, said step of data record location inserting further comprises:

identifying a one of said search segments in which a received data record is written on said magnetic tape; and inserting data, indicative of said identified search segment, into said administrative data.

21. The method of claim 20 wherein said step of data record location inserting further comprises:

writing data, indicative of a number of tracks following a boundary of said identified search segment to which said data record begins, into said administrative data.

22. The method of claim 18 wherein said rewritable medium comprises a magnetic tape, said step of data record location inserting comprises:

writing last data record location data into said administrative data to indicate the physical location on said magnetic tape of an end of a last written data record contained on said magnetic tape.

23. The method of claim 18 wherein said rewritable media comprises a magnetic tape, said step of media information inserting comprises:

writing data indicative of amount of use of said magnetic tape into said administrative data.

24. The method of claim 14 wherein said step of media information inserting comprises:

writing media failure data into said administrative data to record a history of media failures.

* * * * *